(12) United States Patent
Maciejewski

(10) Patent No.: US 8,624,598 B2
(45) Date of Patent: Jan. 7, 2014

(54) MAGNETIC RESONANCE APPARATUS COMPRISING A FASTENING ELEMENT FOR ATTACHING A NOISE-INSULATING ELEMENT AND A METHOD FOR ATTACHING A NOISE-INSULATING ELEMENT

(75) Inventor: Bernd Maciejewski, Markt Erlbach (DE)

(73) Assignee: Siemens Aktiengesellschaft, München (DE)

( * ) Notice: Subject to any disclaimer, the term of this patent is extended or adjusted under 35 U.S.C. 154(b) by 425 days.

(21) Appl. No.: 13/112,065

(22) Filed: May 20, 2011

(65) Prior Publication Data
US 2011/0291656 A1    Dec. 1, 2011

(30) Foreign Application Priority Data
May 28, 2010   (DE) .......................... 10 2010 029 472

(51) Int. Cl.
*G01V 3/00* (2006.01)
(52) U.S. Cl.
USPC .......................................... 324/318

(58) Field of Classification Search
USPC ........................... 324/300–322; 600/407–445
See application file for complete search history.

(56) References Cited

U.S. PATENT DOCUMENTS

| 5,489,848 A * | 2/1996 | Furukawa ..................... 324/318 |
| 2007/0035297 A1 * | 2/2007 | Kitagawa ..................... 324/309 |

FOREIGN PATENT DOCUMENTS

| DE | 19838390 A1 | 3/2000 |
| GB | 2465991 A | 6/2010 |

* cited by examiner

*Primary Examiner* — Brij Shrivastav

(57) ABSTRACT

A magnetic resonance apparatus is provided. The magnetic resonance apparatus comprises a gradient coil unit, a housing cover and a noise protection unit which has at least one noise-insulating element which is arranged between the gradient coil unit and the housing cover for deadening an operating noise of the gradient coil unit. The magnetic resonance apparatus also comprises at least one fastening element for attaching the at least one noise-insulating element. The fastening element engages in a connection with the gradient coil unit for attaching the at least one noise-insulating element.

19 Claims, 5 Drawing Sheets

MAGNETIC RESONANCE APPARATUS COMPRISING A FASTENING ELEMENT FOR ATTACHING A NOISE-INSULATING ELEMENT AND A METHOD FOR ATTACHING A NOISE-INSULATING ELEMENT

CROSS REFERENCE TO RELATED APPLICATIONS

This application claims priority of German application No. 10 2010 029 472.1 filed May 28, 2010, which is incorporated by reference herein in its entirety.

FIELD OF THE INVENTION

The present invention relates to a magnetic resonance apparatus comprising a gradient coil unit, a housing cover and a noise protection unit which has at least one noise-insulating element which is arranged between the gradient coil unit and the housing cover for the purpose of deadening an operating noise of the gradient coil unit, and at least one fastening element for attaching the at least one noise-insulating element.

BACKGROUND OF THE INVENTION

During magnetic resonance measurements conducted with a magnetic resonance apparatus, loud operating noises which are unpleasant for a patient are produced as a result of an interaction between a gradient coil unit and a main magnet of a magnetic resonance apparatus. In this situation design-related gaps and/or free spaces between the main magnet and the gradient coil unit and/or the gradient coil unit and a radio-frequency coil unit radiate and/or conduct the loud operating noises to the outside.

In order to reduce said noise nuisance for the patient it is known to arrange between the gradient coil unit and a housing cover of the magnetic resonance apparatus a noise protection unit which has a noise-insulating effect. With such a solution a noise-insulating element is used to cover in particular design-related gaps and/or free spaces between the main magnet and the gradient coil unit and/or the gradient coil unit and the radio-frequency coil unit which cause in particular an emission of noise externally.

For this purpose it is known to use as noise-insulating elements an insulating foam which is mounted, in particular glued, on the housing cover which is formed by an insert funnel of the magnetic resonance apparatus and is installed on the gradient coil unit in conjunction with the installation of the housing cover. However, said noise-insulating elements have the disadvantage that cables and/or water hoses, for example, and/or additional components, such as, for example, mounting plates, between the gradient coil unit and the housing cover can result in undesirable openings between the insulating foam and a side of the magnet that is to be covered. This leads to inadequate noise protection. However, these openings cannot be seen from outside because the installation is performed in conjunction with the housing cover.

Also provided on a magnetic resonance apparatus is noise protection whereby an insulating foam is mounted onto bolts that are welded onto a main magnet. However, noise-emitting areas are only inadequately sealed off by the insulating foam, with the result that only unsatisfactory noise protection is achieved. A further disadvantage is that an additional assembly or installation step is required in which the bolts have to be welded in one onto the main magnet using a template.

SUMMARY OF THE INVENTION

The object underlying the present invention is in particular to provide a magnetic resonance apparatus having a noise protection unit which allows an in particular simple attachment of a noise-insulating element and at the same time provides effective noise protection. The object is achieved by means of the features of the independent claims. Advantageous embodiments are described in the dependent claims.

The invention relates to a magnetic resonance apparatus comprising a gradient coil unit, a housing cover and a noise protection unit which has at least one noise-insulating element which is arranged between the gradient coil unit and the housing cover for the purpose of deadening an operating noise of the gradient coil unit, and at least one fastening element for attaching the at least one noise-insulating element.

It is proposed that in order to attach the at least one noise-insulating element the fastening element engages in a connection with the gradient coil unit. In this context a housing cover shall be understood to mean in particular a covering of the gradient coil unit and/or the main magnet which substantially covers a front side and/or a rear side of the gradient coil unit and/or the main magnet and which preferably is enclosed by a housing of the magnetic resonance apparatus. The housing cover can in this case be formed by an insert funnel of a housing of the magnetic resonance apparatus. By means of the embodiment according to the invention it is possible to achieve a structurally simple attachment of the at least one noise-insulating element in that the noise-insulating element can be attached by means of the at least one fastening element in particular before the housing cover is installed on in particular noise-emitting areas of the gradient coil unit. Furthermore, effective noise protection is possible in that the at least one noise-insulating element can be attached on the noise-emitting areas with a precision fit and consequently undesirable openings due to additional cables and/or conduits and/or mounting plates can be prevented. The noise-emitting areas are formed in particular by free spaces and/or gaps which are situated between the gradient unit and a main magnet of the magnetic resonance apparatus and/or between the gradient coil unit and a radio-frequency coil unit of the magnetic resonance apparatus and through which the loud operating noises can be conducted externally. A loud operating noise of the magnetic resonance apparatus is generated in particular due to an interaction between the gradient coil unit and the main magnet. The noise protection unit preferably has a plurality of fastening elements for attaching noise-insulating elements.

The at least one fastening element can be secured to the gradient coil unit particularly advantageously by means of a force fit, which means that an adhesive bonding of the noise-insulating element can advantageously be dispensed with and as a result the noise-insulating element, after having been deinstalled, can be available again for reinstallation. Toward that end the gradient coil unit advantageously has at least one receiving zone with at least one opening for receiving the fastening element, the fastening element engaging in at least a force-fit connection with at least one internal wall in order to delimit the receiving zone.

It is furthermore proposed that the gradient coil unit has at least one receiving zone with at least one opening for receiving a shim element and that the fastening element engages in at least a force-fit connection with at least one internal wall in order to delimit the receiving zone. In this context a shim element shall be understood to mean in particular an element by means of which inhomogeneous regions and distortions of the magnetic field can be offset. The shim element can be formed for example by a carrier having a plurality of iron plates which can be introduced into the receiving zone. Preferably the receiving zone extends through the gradient coil unit along a length of the latter. Along its circumferential direction the gradient coil unit can have a plurality of sequentially arranged receiving zones. In this case a particularly cost-effective attachment of the noise-insulating element can be achieved through the use of already present components of the gradient coil unit, in particular the receiving zone for receiving the shim elements, for securing the fastening element, with the result that further components and/or a redesign of the gradient coil unit and/or of the main magnet can advantageously be dispensed with. The force-fit connection between the at least one fastening element and the receiving zone of the gradient coil unit is preferably formed by a clamping connection. The clamping connection is in particular embodied as separable, the fastening element and the noise-insulating element particularly advantageously retaining their functionality by means of a releasing action so that the noise-insulating element can be reused for attachment or, more specifically, for noise protection purposes.

An advantageous introduction, in particular of the fastening element, into an attachment opening of the noise-insulating element can be achieved if the at least one fastening element has a plug with at least one bracing element. The plug is preferably formed from a non-magnetizable, magnetic-resonance-compatible, in particular a non-imaging, material, such as from a plastic material for example. The bracing element can be formed by a rib, the plug preferably having a plurality of ribs in this case. The plug can be formed here by a ribbed plug and/or a dowel plug. Preferably the ribbed plug comprises a main stem which extends along a longitudinal extension, and individual ribs which can be embodied in particular in a circular-disk shape and extend from said main stem substantially at right angles to the longitudinal extension. Furthermore, the at least partial embodiment of the fastening element as a ribbed plug makes possible a particularly favorable fastening element. In principle an embodiment of the fastening element without ribs, for example a plastic plug having alternative bracing elements, is also possible at any time.

It is furthermore proposed that the at least one fastening element has at least one retaining element. In this case an advantageous fixing of the fastening element to the gradient coil unit can be achieved by means of the at least one retaining element in that the latter engages in the clamping connection with in particular the receiving zone of the gradient coil unit for receiving the shim elements. Preferably the at least one retaining element is formed by a retaining ring. However, other embodiments of the retaining element that appear to the person skilled in the art as beneficial are possible at any time.

The retaining element is particularly advantageously arranged along a longitudinal extension of the plug, in particular of the ribbed plug, at an end zone between two brace elements, in particular between two ribs, of the plug. Preferably the retaining element is clamped and/or locked in place between the two brace elements, in particular ribs, and secured so as to prevent its falling out unintentionally. Furthermore, the retaining element is pressed by means of the brace elements, in particular by means of the ribs, into a retaining position and in this manner a sufficiently strong force is generated for attaching the noise-insulating element. The retaining element has an internal diameter which substantially corresponds to an external diameter of the main stem of the plug, so that in addition a clamping effect can be produced between the main stem and the retaining ring due to a static friction for the purpose of attaching and/or securing the retaining ring. Particularly advantageously the internal diameter is in this case substantially equal to 6 mm, as a result of which a sufficiently great inherent rigidity of the fastening element can be achieved.

If the retaining element has a thickness of substantially 2 mm, a sufficiently great tensioning force can be generated in this case inside the retaining element on account of an internal tension which is necessary for a force-fit connection, in particular a clamping connection, with the internal wall of the receiving zone for receiving the shim element. Substantially 2 mm in this context shall be understood in particular to mean that the retaining element has a thickness of 2 mm±0.5 mm.

It is furthermore proposed that the retaining element has an external diameter which is greater than an internal dimension along a radial direction of the receiving zone for receiving the shim element. By this means it is possible to achieve an attachment of the fastening element to the gradient coil unit which is independent of a position of the fastening element, in particular of the retaining element, inside the receiving zone for receiving the shim element. For example, the retaining element can be attached to an edge or in a center of the receiving zone. In this way the retaining element can furthermore produce a clamping connection even when the receiving zone has smooth internal walls, such that a secure and in particular non-slip attachment of the at least one noise-insulating element can be achieved. In this way, in addition, tolerances, for example in a dimension of the noise-insulating element and/or due to additional installation space required for in particular additional cables and/or water conduits, can advantageously be compensated for in that an attachment position of the fastening element inside the receiving zone for receiving the shim element can be varied. The external diameter of the retaining element is in this case substantially equal to 18 mm and an internal dimension of the receiving zone for receiving the shim element is substantially equal to 13 mm, a variation of the external diameter and of the internal dimension being possible at any time. Particularly advantageously a factor of the external diameter of the retaining element divided by the internal dimension of the receiving zone is substantially equal to 1.5.

The retaining element can be formed from any materials appearing to the person skilled in the art as beneficial, in particular materials having good adhesion properties and also being formed from a non-magnetizable, magnetic-resonance-compatible material, such as from an adhesive rubber material and/or from a soft rubber material for example. Particularly advantageously, however, the retaining element is formed from a silicone material, thereby enabling a particularly flexible and nonetheless stable retaining element to be achieved. Owing to the high static friction factor of silicone an advantageous attachment between the retaining element and the internal wall of the receiving zone can be achieved. Furthermore, a particularly cost-effective fastening element can be realized.

In an advantageous development of the invention it is proposed that the at least one fastening element has a washer which in an installed position is arranged between a head of the fastening element and the noise-insulating element. In this case the fastening element head is preferably formed by a terminal head of the ribbed plug. Damage to the noise-insulating element, for example crushing and/or tearing of the noise-insulating element, e.g. during removal and/or deinstallation of the gradient coil unit and/or a radio-frequency coil unit, can advantageously be prevented by the fastening element in this case and consequently a secure and in particular precision-fit attachment of the noise-insulating element to the gradient coil unit achieved. In this arrangement the washer preferably has a larger bearing surface for supporting the noise-insulating element than a bearing surface of the fastening element head. Particularly advantageously the retaining element is formed from a silicone material in this case.

In an advantageous development of the invention it is proposed that the noise-insulating element is formed at least in part from a sound-absorbing insulating foam. Preferably the sound-absorbing insulating foam is implemented exactly matching in shape so as to enable an advantageous, precise sealing-off of noise-emitting components and/or openings to be achieved in particular on the gradient coil unit. It is moreover possible in this way to prevent an adverse effect due to additional cables which may be arranged in particular between the housing cover and the gradient coil unit.

The invention also relates to a fastening element for attaching at least one noise-insulating element to a gradient coil unit of a magnetic resonance apparatus.

In this case it is proposed that the fastening element has a retaining element for providing a force-fit connection with the gradient coil unit. Gluing of the noise-insulating element can particularly advantageously be dispensed with in this case and consequently the noise-insulating element will be available for a reinstallation after having been previously removed. Furthermore, a structurally simple and in particular precision-fit attachment of the at least one noise-insulating element can be achieved in that the noise-insulating element can be attached by means of the at least one fastening element in particular before the housing cover is installed on in particular noise-emitting areas of the gradient coil unit. Preferably the at least one retaining element is formed by a retaining ring, although other embodiments of the retaining element appearing to the person skilled in the art as beneficial are possible at any time.

It is furthermore proposed that the fastening element has a plug, the retaining element being arranged between two brace elements of the plug. In this case the plug can be fanned particularly cost-effectively by a ribbed plug having ribs as brace elements. Preferably the retaining element is clamped in place between the two brace elements and secured so that it cannot fall out unintentionally. The retaining element is additionally pressed into a retaining position by means of the brace elements and in this way the retaining element is wedged by means of individual brace elements of the plug, thereby generating a sufficiently great force for attachment of the noise-insulating element.

Particularly advantageously the fastening element includes a washer which in an installed position is arranged between a head of the fastening element and the noise-insulating element. Damage to the noise-insulating element, crushing and/or tearing of the noise-insulating element for example, can advantageously be prevented by the fastening element and consequently a secure and in particular precision-fit attachment of the noise-insulating element to the gradient coil unit can be achieved. In this arrangement the washer preferably has a larger bearing surface for placement onto the noise-insulating element than a bearing surface of the fastening element head.

The invention furthermore relates to an attachment method for attaching at least one noise-insulating element to a magnet unit, in particular a gradient coil unit, of a magnetic resonance apparatus, the method comprising the following steps an introduction step, wherein the fastening element is introduced into a recess of the noise-insulating element, an attachment step, wherein the at least one noise-insulating element is attached to the magnet unit by means of the fastening element, a covering step, wherein upon completion of the attachment step a housing cover is mounted around the at least one noise-insulating element onto the magnetic resonance apparatus.

It is proposed that in the attachment step the fastening element is fixed to the magnet unit by means of a force-fit connection.

BRIEF DESCRIPTION OF THE DRAWINGS

Further advantages will emerge from the following description of the drawings. Exemplary embodiments of the invention are illustrated in the drawings. The drawings, the description and the claims contain numerous features in combination. The person skilled in the art will expediently consider the features also individually and combine them into beneficial further combinations.

DETAILED DESCRIPTION OF THE INVENTION

Figure 1:
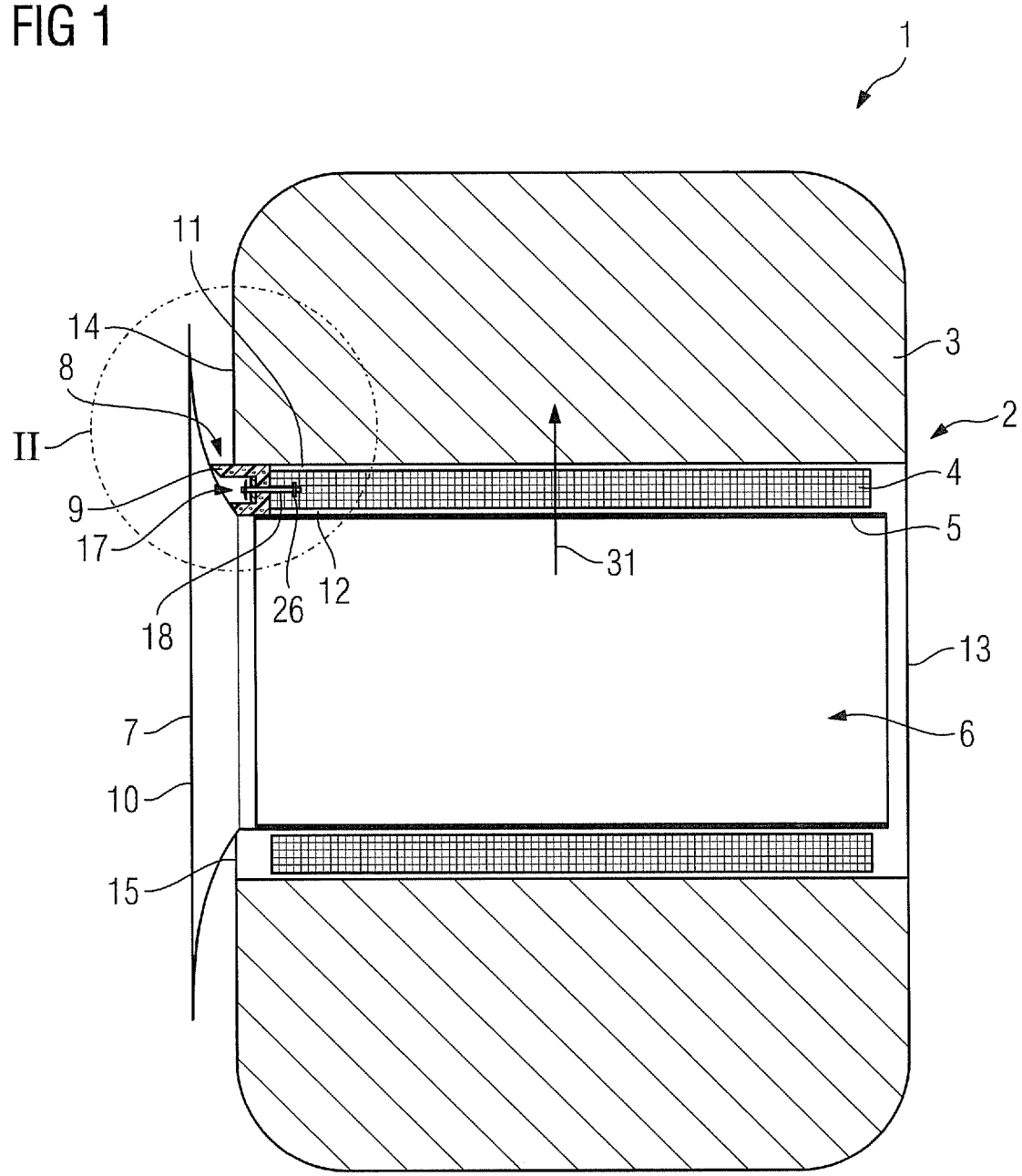
FIG. 1 shows an inventive magnetic resonance apparatus comprising a noise protection unit in a schematic representation.

FIG. 1 shows a schematically simplified representation of an inventive magnetic resonance apparatus 1. The magnetic resonance apparatus 1 comprises a magnet unit 2 having a main magnet 3 for generating a constant main magnetic field. The magnet unit 2 also includes a gradient coil unit 4 for generating a linear gradient field and a radio-frequency coil unit 5 for generating a radio-frequency field of view. The magnetic resonance apparatus 1 additionally includes a cylindrical receiving zone 6 for receiving a patient. The patient can be introduced into the receiving zone 6 by means of a patient couch (not shown in further detail) of the magnetic resonance apparatus 1. Alternatively hereto, the receiving zone 6 can also be embodied as slightly conical in shape.

The magnetic resonance apparatus 1 depicted schematically in FIG. 1 can obviously include further components that magnetic resonance apparatuses typically have, such as, for example, a control unit, etc. A general mode of operation of a magnetic resonance apparatus is well-known to the person skilled in the art, so a detailed description of the general components will be dispensed with.

Figure 2:
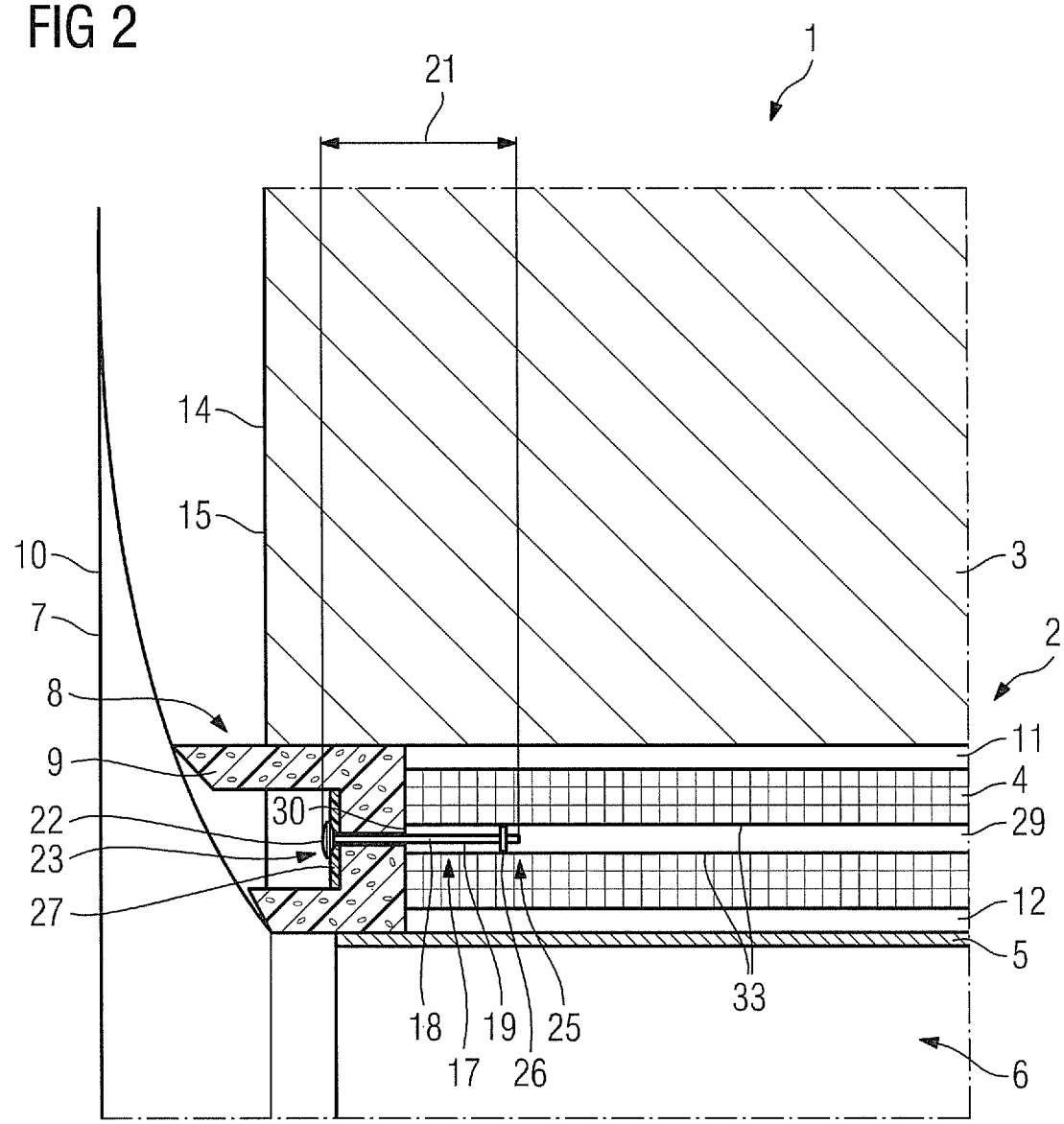
FIG. 2 shows a detail view of the magnetic resonance apparatus from FIG. 1 in a schematic representation.
Figure 3:
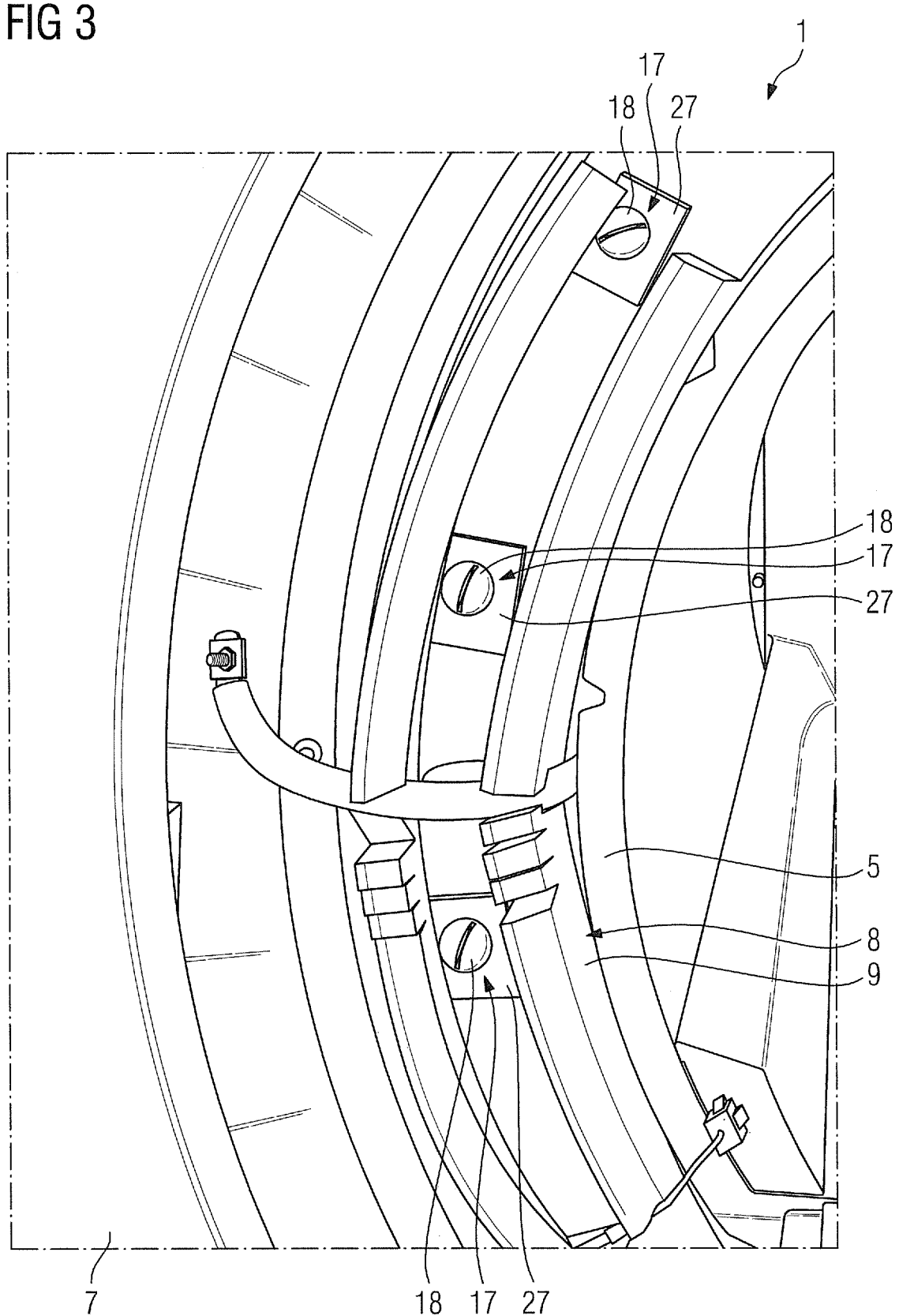
FIG. 3 shows a detail of a rear view of the magnetic resonance apparatus.
Figure 4:
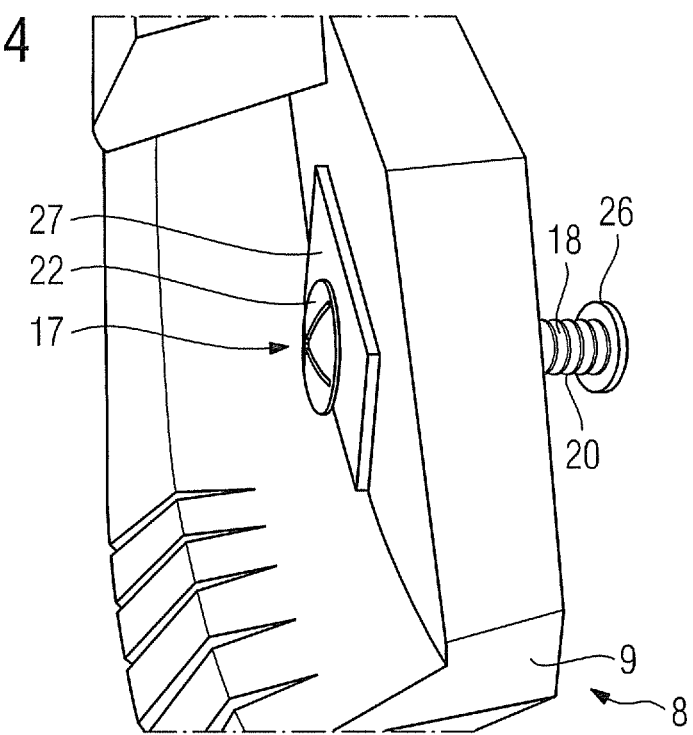
FIG. 4 shows the noise protection unit with a fastening element and a noise-insulating element.

The main magnet 3, the gradient coil unit 4 and the radio-frequency coil unit 5 are enclosed by a housing 7 of the magnetic resonance apparatus 1, the housing 7 comprising individual housing covers 10. Arranged between the housing 7 and the magnet unit 2 is a noise protection unit 8 of the magnetic resonance apparatus 1. Said noise protection unit comprises a plurality of noise-insulating elements 9, each of which is formed from a sound-absorbing insulating foam. In this exemplary embodiment the noise-insulating elements 9 are installed by way of example at a rear side 15 of the magnetic resonance apparatus 1 between the magnet unit 2 and a housing cover 10 of the housing 7 in order to shield a patient at least partially from unpleasant loud noises generated during the operation of the magnetic resonance apparatus 1 due to an interaction between the gradient coil unit 4 and the main magnet 3 (FIGS. 1 to 3). Alternatively hereto, the noise protection unit 8 could also be arranged in a front side of the magnetic resonance apparatus 1.

In the present arrangement, design-related noise-emitting free spaces 11, 12 and/or gaps between the gradient coil unit 4 and the main magnet 3 and between the gradient coil unit 4 and the radio-frequency coil unit 5 are covered by means of the noise-insulating elements 9. In particular the noise-insulating elements 9 of the noise protection unit 8 cover noise-emitting gaps and/or free spaces 11, 12 of a magnet unit side 14 which is disposed opposite an introduction bore 13 of the receiving zone 6 for introducing the patient, the noise-insulating elements 9 covering a substantially circular-disk-shaped area between the magnet unit 2 and a housing cover 10 (FIG. 2). Furthermore, the individual noise-insulating elements 9 are implemented to provide a precise fit and/or to a precise shape and are matched to a geometry of the rear side of the magnet unit 2, in particular the rear side 15 of the gradient coil unit 4, so that effective and efficient noise protection is achieved during the operation of the magnetic resonance apparatus 1. In this way additional cables and/or conduits can also be taken into account in the design of the noise-insulating elements 9. In this case the housing cover 10 is formed by an insert funnel which encloses a rear opening of the receiving zone 6 in a circumferential direction and in addition partially shields off the magnet unit 2, in particular the gradient coil unit 4 and the radio-frequency coil unit 5, externally.

For the purpose of attaching the individual noise-insulating elements 9 the noise protection unit has a plurality of fastening elements 17 (FIGS. 1 to 6). The individual fastening elements 17 each have a plug with a plurality of brace elements. In this case the plug is formed by a ribbed plug 18 formed from a magnetic-resonance-compatible, non-magnetizable material. Preferably the ribbed plug is formed from a plastic material. The ribbed plug 17 has a main stem 19 and a plurality of brace elements embodied as ribs 20, the individual ribs 20 being embodied in a single piece with the main stem 19. The individual ribs 20 are embodied as circular-ring-shaped and have a main extension surface area which is embodied substantially at right angles to a longitudinal extension 21 of the main stem 19. The main stem 19 is embodied in the shape of a cylinder and in the present exemplary embodiment has a diameter of approx. 6 mm. In addition the longitudinal extension 21 of the main stem 19 is equal in this case to approx. 60 mm. The individual ribs have an external diameter of approx. 12 mm. In an alternative embodiment of the invention a geometry and/or individual dimensions of the plug may vary from the geometry depicted here and/or the dimensions shown here, such as alternative brace elements, for example, and/or a bellows-like implementation could likewise be conceivable.

Furthermore the ribbed plug 18 includes a fastening element head 22 which is arranged along the longitudinal extension 21 of the main stem 19 at an end zone 23 of the main stem 19. The main stem 19 and the fastening element head 22 are also integrally embodied with one another in a single piece, the fastening element head 22 also being foliated from a magnetic-resonance-compatible, non-magnetizable material. On a side facing toward the ribs 20 the fastening element head 22 has a circular bearing surface which is oriented substantially vertically with respect to the longitudinal extension 21 of the main stem 19 and which in addition is larger than the main extension surface area of the individual ribs 20. In an alternative embodiment of the invention the fastening element can simply have a main stem with a fastening element head and in addition dispense with an implementation having ribs.

At an end zone 25 facing away from the fastening element head 22 along the longitudinal extension 21 of the main stem 19 the fastening element 17 has a retaining element 26 which is formed by a retaining ring. The retaining ring is formed from a magnetic-resonance-compatible, non-magnetizable material and in this case from a silicone material. In order to attach the retaining ring 26 to the ribbed plug 18 the retaining ring is fixed between two ribs 20 directly adjacent to each other, the two ribs 20 being arranged at an end zone 26 of the main stem 19 facing away from the fastening element head 22. The retaining ring is in this case clamped and/or locked in place between the two ribs 20, such that the two ribs 20 secure the retaining ring and prevent it from falling out unintentionally. In this exemplary embodiment the retaining ring has an internal diameter of approx. 6 mm and an external diameter of approx. 18 mm. In addition the retaining ring has a thickness of substantially 2 mm. In an alternative embodiment of the invention a geometry and/or individual dimensions of the retaining element 26 may vary from the geometry depicted here and/or the dimensions shown here. In an embodiment variant of the fastening element 17 without ribs 20 the retaining ring can also be secured by means of the main stem 19 of the fastening element.

The fastening element 17 also has a washer 27 which in an installed position is arranged between the bearing surface of the fastening element head 22 facing toward the ribs 20 and the noise-insulating element 9. The washer 27 is likewise formed from a magnetic-resonance-compatible, non-magnetizable material and in this case is formed from a silicone material. In addition the washer 27 has a bearing surface which is larger than a bearing surface of the fastening element head 22. In this exemplary embodiment the bearing surface has a length of approx. 50 mm, a width of approx. 35 mm and a thickness of approx. 2 mm. An alternative embodiment of the washer 27 is conceivable at any time.

Figure 5:
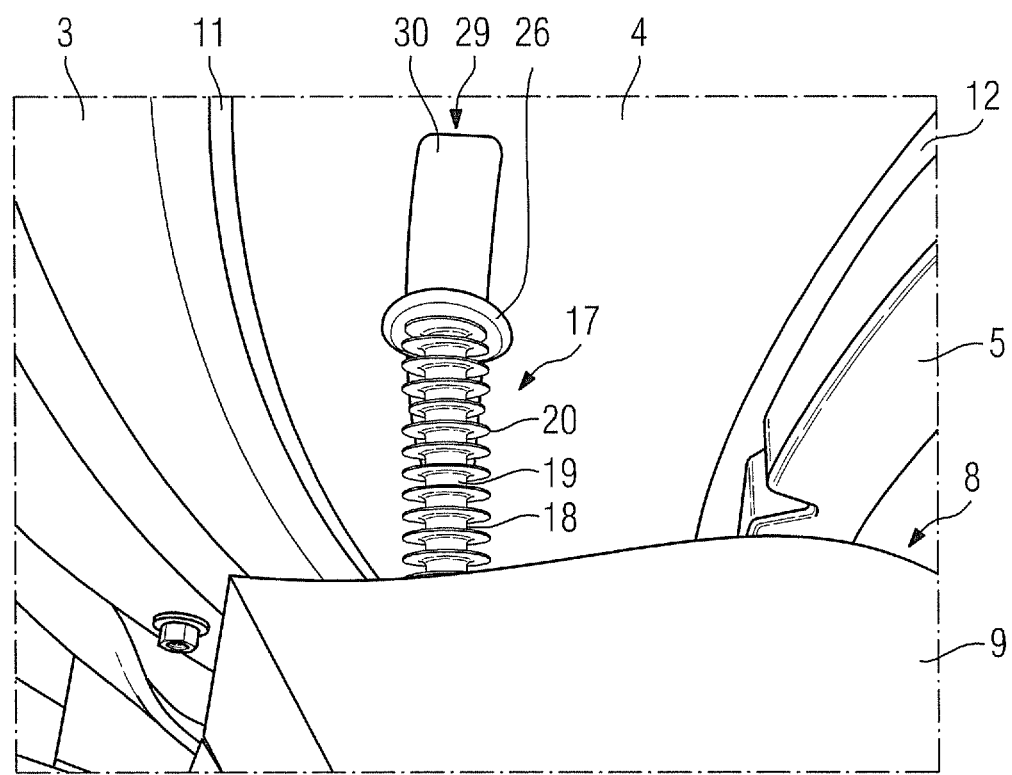
FIG. 5 shows the noise protection unit and the gradient coil unit prior to an installation of the noise protection unit.
Figure 7:
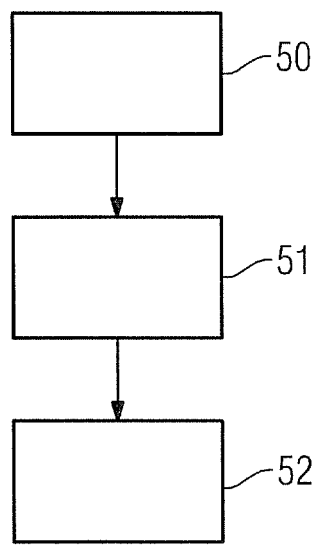
FIG. 7 shows a fastening method according to the invention.

For the purpose of attaching the individual noise-insulating elements 9 to the magnet unit 2 the noise-insulating elements 9 have preformed recesses which extend through the noise-insulating elements 9 along a thickness thereof. For the purpose of mounting the noise-insulating element 9 on the gradient coil unit 4 the fastening element 17 is initially introduced, with the retaining ring to the fore, into the preformed recess in an introduction step 50 (FIGS. 3, 5 and 7). The fastening element 17 is then connected to the gradient coil unit 4 by means of a force fit.

Figure 6:
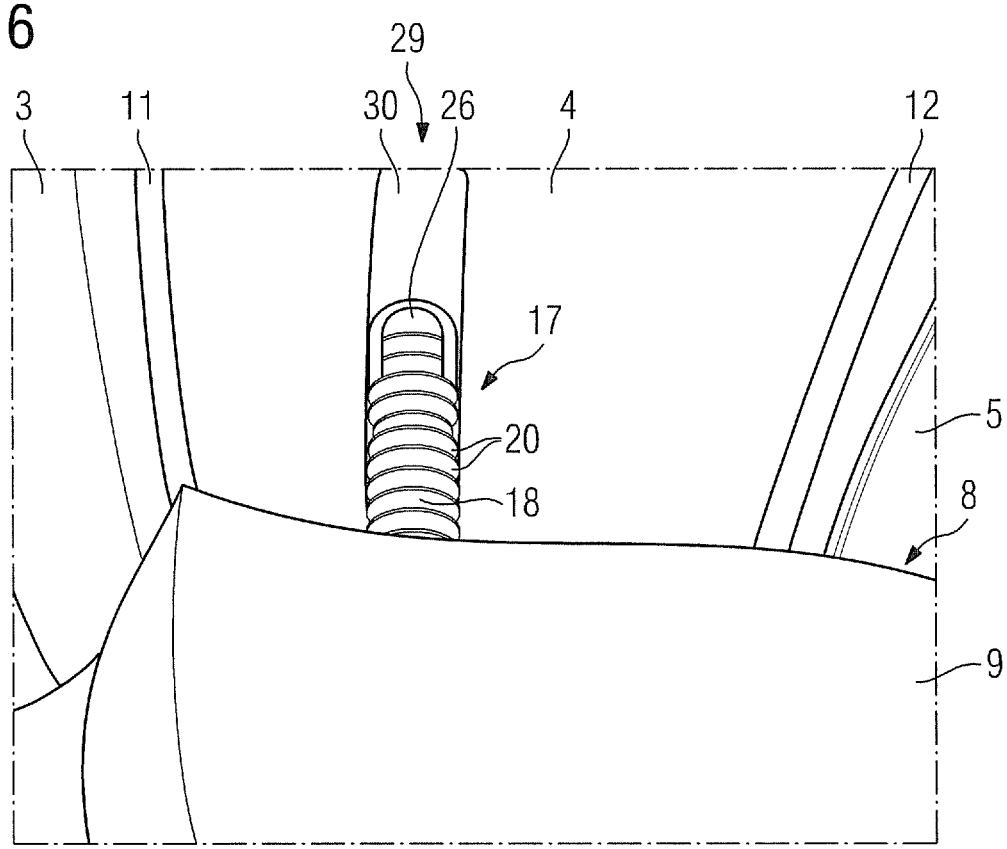
FIG. 6 shows the noise protection unit in an installed position on the gradient coil unit.

The gradient coil unit 4 has a plurality of receiving zones 29 for receiving shim elements (not shown in further detail). The receiving zones 29 each include an opening 30 into which the fastening element 17 is introduced with the retaining ring to the fore in order to attach the noise protection unit 8 (FIGS. 5 and 6). The openings 30 of the receiving zones 29 for fixing the fastening elements 17 are arranged at the rear side (service end) of the gradient coil unit 4, while the shim elements (not shown) are introduced into the receiving zones 29 at a front side (patient end). If the shim elements are to be introduced into the receiving zones 29 at the rear side, the noise protection unit 8 can also be arranged at the front side of the gradient coil unit 4 and the fastening elements 17 can be introduced at the front side of the receiving zones 29. Furthermore, an installation and/or arrangement of the noise protection unit 8 both at the rear side and at the front side of the gradient coil unit 4 are/is also conceivable. It is also possible to make separate holes on the gradient coil unit 4 and/or the main magnet 3 in order to fix the fastening elements.

The external diameter of the retaining ring is in this case greater than an internal dimension of the receiving zones 29 for receiving the shim elements along a radial direction 31 of the magnet unit 2, a factor of the external diameter to the internal dimension being substantially 1.5. In this exemplary embodiment the internal dimension of the receiving zones 29 amounts to approx. 13 mm.

In an attachment step 51, during an operation to introduce the fastening element 17, the retaining rings are, by virtue of their embodiment, bent contrary to a direction of an introduction movement in such a way that as a result a tensioning force is produced which leads to a force-fit connection, which in this case is formed by a clamping and/or wedging effect, of the fastening elements 17, in particular of the retaining rings of the fastening elements 17, with an internal wall 33 for delimiting the receiving zone 29 for receiving the shim elements (FIG. 6 and FIG. 7). The force-fit and/or clamping connection between the retaining ring and the internal wall 33 of the receiving zones 29 of the gradient coil unit 4 is reinforced by an arrangement of the retaining ring between the two ribs 20 in that the latter, because of their small size, have a rigid orientation which is substantially at right angles to the longitudinal extension 21 of the main stem 19, and consequently press the retaining ring in the direction of the introduction movement during the introduction step 50 and the attachment step 51. In the process the ribs 20 key with the retaining ring.

Owing to the type of attachment an attachment position of the fastening elements 17 is conceivable at any position inside the receiving zone, for example in the region of a center or a edge area of the receiving zones 29 for receiving the shim elements. In the attachment step 51 for attaching the noise protection unit 8 the fastening elements 17 are introduced far enough into the receiving zones 29 for receiving the shim elements until the noise-insulating elements 9 securely butt against the gradient coil unit 4 of the magnet unit 2. If, during the introduction step 50 and/or the attachment step 51, the noise-insulating elements 9 are not yet resting in contact with the gradient coil unit 4, an installation position of the individual noise-insulating elements 9 can be corrected particularly easily to ensure that the noise-insulating elements 9 cover the noise-emitting free spaces 12, 13 and/or gaps between the gradient coil unit 4 and the main magnet 3 and/or the radio-frequency coil unit 5 with maximum precision. Even in an installed position of the noise-insulating elements 9 it is still conceivable to make a slight correction of the position. In an installed position of the noise-insulating elements 9 the washer 27 has the function of preventing the noise-insulating elements 9 from being indented and/or torn by the fastening element 17, in particular by the fastening element head 22. Owing to the large bearing surface a force and/or pressure exerted by the fastening element head 22 is distributed over the entire washer 27.

After all of the noise-insulating elements 9 have been fixed on the gradient coil unit 4 in this manner, the housing cover 10, in particular the insert funnel, is then fitted on in a covering step 52 and mounted onto the housing 7 and/or the magnet unit 2.

The invention claimed is:

1. A magnetic resonance apparatus, comprising:
 a gradient coil unit;
 a housing cover;
 a noise protection unit comprising a noise-insulating element arranged between the gradient coil unit and the housing cover for deadening an operating noise of the gradient coil unit; and
 a fastening element connected to the gradient coil unit for attaching the noise-insulating element.

2. The magnetic resonance apparatus as claimed in claim 1, wherein the fastening element is connected to the gradient coil unit by a force fit connection.

3. The magnetic resonance apparatus as claimed in claim 1, wherein the gradient coil unit comprises a receiving zone with an opening for receiving the fastening element, and wherein the fastening element is connected to an internal wall by a force fit connection to delimit the receiving zone.

4. The magnetic resonance apparatus as claimed in claim 1, wherein the gradient coil unit comprises a receiving zone with an opening for receiving a shim element, and wherein the fastening element is connected to an internal wall by a force-fit connection to delimit the receiving zone.

5. The magnetic resonance apparatus as claimed in claim 1, wherein the fastening element comprises a plug with a brace element.

6. The magnetic resonance apparatus as claimed in claim 5, wherein the fastening element comprises a retaining element.

7. The magnetic resonance apparatus as claimed in claim 6, wherein the retaining element is arranged along a longitudinal extension of the plug at an end zone between two brace elements of the plug.

8. The magnetic resonance apparatus as claimed in claim 6, wherein the retaining element has a thickness of 2 mm.

9. The magnetic resonance apparatus as claimed in claim 6, wherein the retaining element has an external diameter that is greater than an internal dimension along a radial direction of the receiving zone.

10. The magnetic resonance apparatus as claimed in claim 6, wherein the retaining element has an external diameter of 18 mm.

11. The magnetic resonance apparatus as claimed in claim 6, wherein the retaining element comprises a silicone material.

12. The magnetic resonance apparatus as claimed in claim 1, wherein the fastening element comprises a washer arranged between a head of the fastening element and the noise-insulating element.

13. The magnetic resonance apparatus as claimed in claim 12, wherein the washer comprises a silicone material.

14. The magnetic resonance apparatus as claimed in claim 1, wherein the noise-insulating element comprises a sound-absorbing insulating foam.

15. A fastening element for attaching a noise-insulating element to a gradient coil unit of a magnetic resonance apparatus, comprising:
 a retaining element for providing a force-fit connection with the gradient coil unit.

16. The fastening element as claimed in claim 15, further comprising a plug with at least one brace element.

17. The fastening element as claimed in claim 16, wherein the plug comprises two brace elements and the retaining element is arranged between the two brace elements.

18. The fastening element as claimed in claim 15, further comprising a washer arranged between a head of the fastening element and the noise-insulating element.

19. A method for attaching a noise-insulating element to a gradient coil unit of a magnetic resonance apparatus, comprising:

introducing a fastening element into a recess of the noise-insulating element;
connecting the fastening element to the gradient coil unit by a force fit connection;
attaching the noise-insulating element to the gradient coil unit by the fastening element; and
mounting a housing cover around the noise-insulating element onto the magnetic resonance apparatus.

\* \* \* \* \*